United States Patent [19]

Suganuma

[11] Patent Number: 5,895,479

[45] Date of Patent: Apr. 20, 1999

[54] PREDICTION FILTER

[75] Inventor: Hisashi Suganuma, Saitama, Japan

[73] Assignee: Pioneer Electronic Corporation, Tokyo, Japan

[21] Appl. No.: 07/907,617

[22] Filed: Jul. 2, 1992

[30] Foreign Application Priority Data

Jul. 12, 1991 [JP] Japan ................................. 3-172709

[51] Int. Cl.$^6$ .................................................. G06F 17/10
[52] U.S. Cl. ................................. 708/301; 708/319
[58] Field of Search ........................ 708/301, 319

[56] References Cited

U.S. PATENT DOCUMENTS

| | | | |
|---|---|---|---|
| 4,691,293 | 9/1987 | Conboy | 364/724.16 |
| 4,841,463 | 6/1989 | Mehrgardt et al. | 364/724.16 |
| 4,953,118 | 8/1990 | Göckler | 364/724.16 |

OTHER PUBLICATIONS

IEEE Transactions on Acoustics, Speech and Signal Processing, vol. 28, No. 5, Oct. 1980, New York.

*Primary Examiner*—David H. Malzahn
*Attorney, Agent, or Firm*—Sughrue Mion Zinn Macpeak & Seas

[57] ABSTRACT

The present invention relates to a prediction filter that estimates the next sampled value from previously sampled values, and which provides an improved prediction filter that makes a prediction with little error, even for an input signal containing a frequency component close to one-half the sampling frequency. Concatenated delay circuits delay sampled values by a sampling time interval (T). Coefficient circuits multiply the outputs of the delay circuits by a certain value, and an adder sums the outputs of the coefficient circuits. Sampled values at time t=T, 0, -T, -2T, . . . are assumed to be $y_1$, $y_0$, $y_{-1}$, $y_2$, . . . and a predicted value at t=T to be $<y_1>$. These are used to generate new variables $<y1>=y_0$, $y_0=y_{-1}$, $y_{-1}=y_{-2}$, . . . The new variables are then substituted into first- and second-degree prediction equations to produce a predicted value $<y_1>$, and the coefficient of each term of the equation for $<y_1>$ is used as the multiplication factor of each coefficient circuit.

1 Claim, 2 Drawing Sheets

INPUT SIGNAL CONTAINING A FREQUENCY COMPONENT HALF THE SAMPLING FREQUENCY

PREDICTION FILTER

BACKGROUND OF THE INVENTION

1. Field of the Invention

This invention relates to a prediction filter that estimates a next sampled value from the sampled values that were sampled at the sampling frequency.

2. Description of the Prior Art

A conventional prediction filter is explained by referring to FIG. 2. FIG. 2 shows a configuration in the case of a first-degree prediction, in which a sampled value sampled at the sampling frequency is entered into the input terminal.

Designated 10, 11 are delay circuits that store sampled values and delay them by a sampling time interval T and output them to the next stage.

Designated 20, 21 are coefficient circuits that multiply the outputs of the delay circuits 10, 11 by a certain value and output the results.

Reference numeral 30 represents an adder that adds up the output values of the coefficient circuits 20, 21 to produce a prediction value.

The coefficients of the coefficient circuits 20, 21 have conventionally been determined as explained below.

Let sampled values at time t=T, 0, -T, -2T, . . . be $y_1, y_0, y_{-1}, y_{-2}, \ldots$. The prediction equation is given as $$y = at + b \quad (1)$$

Substituting $y = y_0$ when $t=0$ into the equation (1), we obtain $$y_0 = b \quad (2)$$

Substituting $y = y_{-1}$ when $t = -T$ into the equation (1) results in $$y_{-1} = -aT + b \quad (3)$$

Substituting the equation (2) into the equation (3) gives $$aT = y_0 - y_{-1} \quad (4)$$

Thus, the prediction value $<y_1>$ at $t=T$ is obtained by substituting $t=T$ into t. That is, $$<y_1> = aT + b \quad (5)$$

Substituting the equation (4) and (2) into the equation (5), we get $$<y_1> = (y_0 - y_{-1}) + y_0 = 2y_0 - y_{-1} \quad (6)$$

That is, the sampled value $y_0$ at $t=0$ is multiplied by 2 and the sampled value at $t=-T$ is multiplied by $-1$ or inverted, and they are summed up to produce a prediction value $<y_1>$ at $t=T$.

Therefore, the multiplication factor of the coefficient circuit 20 is set to 2 and that of the coefficient circuit 21 to $-1$.

When making prediction in the form of second-degree equation, the prediction equation is given by $$y = at^2 + bt + c \quad (7)$$

$y = y_0$ when $t=0$ is substituted in equation (7) to produce $$y_0 = c \quad (8)$$

Substituting $y = y_{-1}$ when $t=-T$ into the equation (7), we obtain $$y_{-1} = aT^2 - bT + c \quad (9)$$

Substituting $y = y_{-2}$ when $t = -2T$ into the equation (7) results in $$y_{-2} = 4aT^2 - 2bT + c \quad (10)$$

From equation (8), (9) and (10), aT, bT and c are determined.

$$aT^2 = (y_2 - 2y_{-1} + y_0)/2 \quad (11)$$

$$bT = (y_{-2} - 4y_{-1} + 3y_0)/2 \quad (12)$$

$$c = y_0 \quad (13)$$

The prediction value y1 at $t=T$ is obtained as follows. $t=T$ is substituted in equation (7) and we get $$<y_1> = aT^2 + bT + c \quad (14)$$

Substituting the equation (11), (12) and (13) into equation (14) results in $$<y_1> = 3y_0 - 3y_{-1} + y_{-2} \quad (15)$$

Therefore, in the case of prediction based on the second-degree equation, the configuration of the prediction filter in FIG. 2 is added with another stage of a delay circuit and a coefficient circuit, all stages connected to an adder, and the multiplication factors of the coefficient circuits are set, starting from the input side, to 3, -3 and 1.

In the above, we have described how the multiplication factors for the coefficient circuits based on the first-and second-degree equations are set. Similar setting is also done for the prediction based on the higher-degree equation.

In the conventional prediction filter, the coefficient circuit uses as a multiplication factor a coefficient determined as mentioned above.

As shown in FIG. 3, even when the input signal is superimposed with a signal component whose frequency is close to ½ the sampling frequency, we get $$y_0 = (y_0) + \Delta y \text{ and}$$

$$y_{-1} = (y_{-1}) - \Delta y$$

and, as shown in equation (6), the prediction based on the first-degree equation is as follows.

$$<y_1> = 2y_0 - y_{-1} = 2(y_0) - (y_{-1}) + 3\Delta y \quad (16)$$

The predicted value $<y_1>$, which is greatly different from the input signal value $y_1$ (=$2(y_0) - y_{-1}$), is output from the adder 30.

In the case of the prediction based on a second-degree equation, the predicted value is given by equation (15). In this case also, the output predicted value is largely different from the input signal value.

SUMMARY OF THE INVENTION

This invention is intended to provide an improved prediction filter which outputs a predicted or estimated value with small errors even when the input signal is superimposed with a signal component whose frequency is close to ½ the sampling frequency.

Means employed in this invention to solve the above-mentioned problems are described below.

A prediction filter according to this invention comprising: concatenated delay circuits for storing sampled values sampled at a sampling frequency and for delaying sampled values by a sampling time interval (T); coefficient circuits for multiplying the outputs of the delay circuits with a certain value; and an adder that adds up the outputs of the coefficient circuits to estimate a next sampled value; whereby sampled values at time t=T, 0, -T, -2T, . . . are assumed to be $y_1$, $y_0$, $y_{-1}$, $y_{-2}$, . . . and a predicted value at t=T to be<$y_1$>, these are used to generate new variables<$y_1$>+$y_0$, $y_0$+$y_{-1}$, $y_{-1}$+$y_{-2}$, . . . . the new variables are then substituted into first- and second-degree prediction equations to produce a predicted value<$y_1$>, and the coefficient of each term $y_0$, $y_{-1}$, $y_{-2}$, . . . of the equation for<$y_1$> is used as the multiplication factor of each coefficient circuit.

The setting of the multiplication factors for the coefficient circuits that multiply the outputs of the concatenated delay circuits with a certain value is done as follows. The variables at time t=T, 0, -T, -2T, . . . are defined as new variables:<$y_1$>+$y_0$, $y_0$+$y_{-1}$, $y_{-1}$+$y_{-2}$, . . . Substituting these new variables into the first- and second-degree prediction equations produces prediction values<$y_1$>. The coefficients of terms $y_0$, $y_{-1}$, $y_{-2}$ in the equation for<$y_1$> are used as multiplication factors of the coefficient circuits.

As mentioned above, the value added with a variable of one sampling cycle later is taken as a new variable. This new variable is substituted into the prediction equation to determine a predicted value. The coefficient of the original variable in the equation for the predicted value is taken as a multiplication factor for the coefficient circuit. This ensures that a prediction value has little error even when the input signal is superimposed with a signal component whose frequency is close to ½ the sampling frequency.

Other objects and features of the invention will be more fully understood from the following detailed description and appended claims when taken in conjunction with the accompanying drawings.

DETAILED DESCRIPTION OF THE PREFERRED EMBODIMENTS

Figure 1:
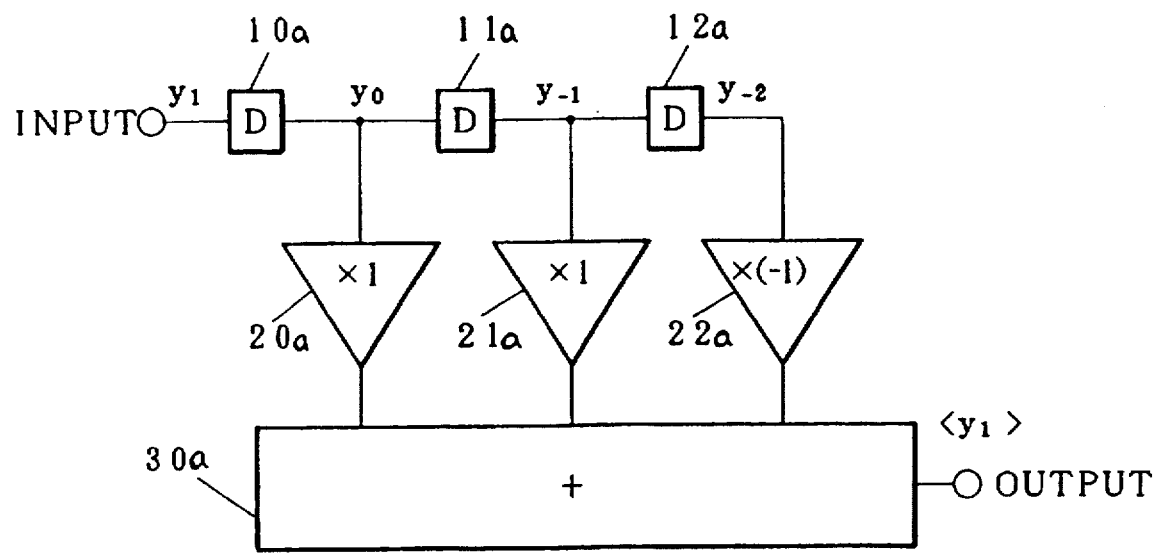
FIG. 1 is a configuration of one embodiment of the invention.
Figure 2:
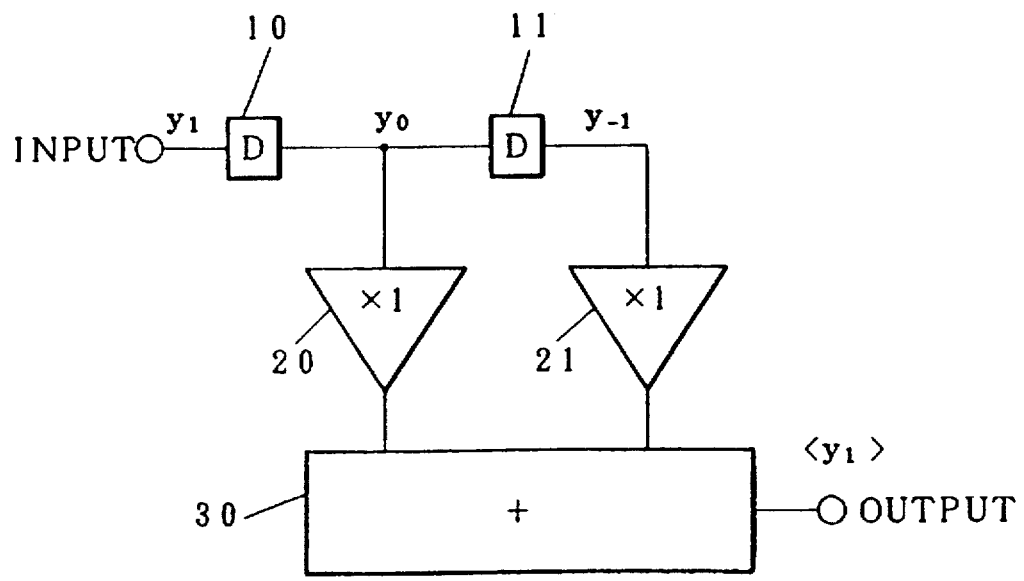
FIG. 2 is a configuration of a conventional example.

In the following, one embodiment of this invention is described by referring to FIG. 1. FIG. 1 represents the configuration for the prediction based on the first-degree equation.

Input terminal is supplied with sampled values that were sampled at the sampling frequency. Denoted 10a, 11a, 12a are delay circuits that store sampled values and delay them by the sampling time interval T before putting them out to the next stage.

Designated 20a, 21a, 22a are coefficient circuits that multiply the outputs of the delay circuits 10a, 11a, 12a with a certain value.

An adder 30a adds up the output values of the coefficient circuits 20a, 21a, 22a and outputs the result as a prediction value.

The multiplication factor of each coefficient circuit according to this invention is set as follows.

New variables at time t=T, 0, -T, -2T, . . . are considered, i.e.,<$y_1$>+$y_0$, $y_0$+$y_{-1}$, $y_{-1}$+$y_{-2}$, $y_{-2}$+$y_{-3}$, . . . By substituting these new variables in the first-degree prediction equation, the predicted value<$y_1$> at t=T is determined.

As mentioned in the conventional example, the predicted value<y> determined by the first-order prediction equation is given by equation (6).<$y_1$>, $y_0$ and $y_{-1}$ in the equation (6) are replaced with<$y_1$>+$y_0$, $y_0$+$y_{-1}$ and $y_{-1}$+$y_{-2}$ and we get $$(<y_1>+y_0)=2(y_0+y_{-1})-(y_{-1}+y_{-2}) \tag{17}$$

Solving the equation (17) for<$y_1$>, $$<y_1>=y_0+y_{-1}-y_{-2} \tag{18}$$

The predicted value<$y_1$> at t=T is obtained by adding up a sampled value $y_0$ at t=0, a sampled value $y_{-1}$ at t=-T and a sampled value $y_{-2}$ at t=-2T multiplied by -1.

Hence, the multiplication factors for the coefficient circuits 20a, 21a, 22a are set to 1, 1 and -1.

Figure 3:
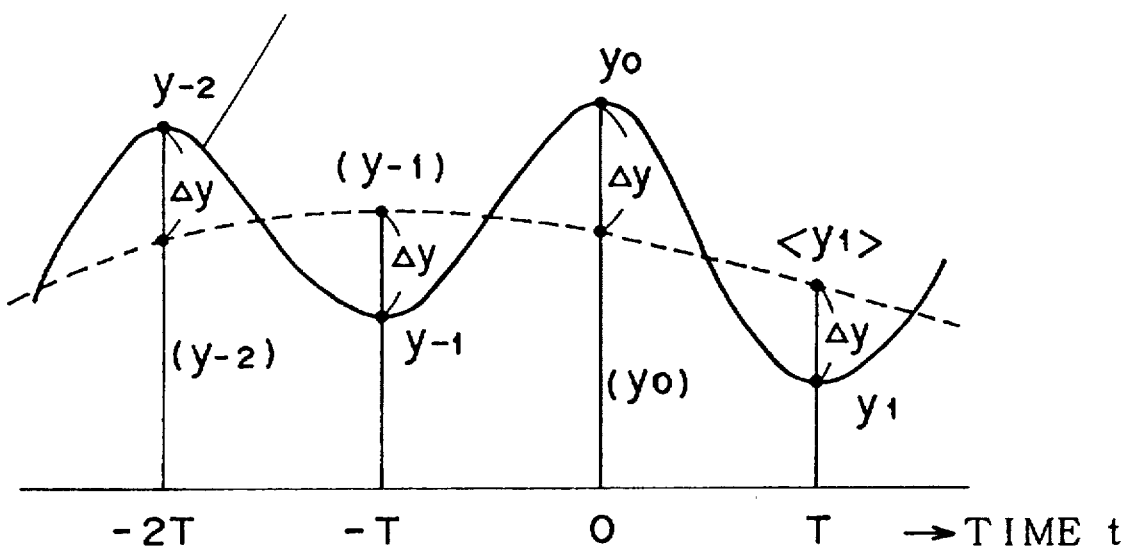
FIG. 3 is an explanatory diagram showing the problem that this invention is intended to solve.

With the multiplication factors for the coefficient circuits set in this way, it is possible to obtain a prediction value that has a small error even for an input shown in FIG. 3.

In the case of prediction based on a second-degree equation,<$y_1$>, $y_0$, $y_{-1}$ and $y_{-2}$ are replaced with new variables<$y_1$>+$y_0$, $y_0$+$y_{-1}$, $y_{-1}$+$y_{-2}$, $y_{-2}$+$y_{-3}$.

$$(>y_1>+y_0)=3(y_0+y_{-1})-3(y_{-1}+y_{-2})+(y_{-2}+y_{-3}) \tag{19}$$

From equation (19),<$y_1$> is determined as $$<y_1>=2y_0-2y_{-2}+y_{-3} \tag{20}$$

Therefore, in the case of prediction based on a second-degree equation, the configuration of the prediction filter in FIG. 1 is added with another stage of a delay circuit and a coefficient circuit, all stages connected to an adder, and the multiplication factors of the coefficient circuits are set, starting from the input side, to 2, 0, -2 and 1.

For the prediction based on a third- or higher-degree equation, a similar process is followed to determine the multiplication factor of each coefficient circuit.

[Effect of the Invention]

As described above, this invention offers the following advantages.

The value added with a variable of one sampling cycle later is taken to be a new variable. The new variable is substituted into the prediction equation to determine a predicted value. The coefficient of the original variable in the equation for the predicted value is used as the multiplication factor of the coefficient circuit. This makes it possible to produce a predicted value that has little error even when the input signal contains a signal component whose frequency is close to one-half the sampling frequency.

Having now fully described the invention, it will be apparent to one of ordinary skill in the art that many changes and modifications can be made thereto without departing from the spirit and scope of the invention as set forth herein.

What is claimed is:

1. A prediction filter comprising:
   concatenated delay circuits for storing sampled values sampled at a sampling frequency and for delaying sampled values by a sampling time interval (T);
   coefficient circuits for multiplying the outputs of the delay circuits with multiplication factors; and
   an adder that adds up the outputs of the coefficient circuits to estimate a next sampled value;
   whereby, with sampled values at times t=T, 0, -T, -2T, . . . respectively assumed to be $y_1$, $y_0$, $y_{-1}$, $Y_{-2}$, . . . and a predicted value at time t=T assumed to be $<y_1>$, said predicted value $<y_1>$ and said sampled values $y_0$, $y_{-1}$, . . . , are replaced by new variables $<y_1>+y_0$, $y_0+y_{-1}$, $Y_{-1}+y_{-2}$, . . . , and the new variables are then substituted into a prediction equation to produce a new predicted value $<y_1>$, and the coefficient of each term $y_0$, $y_{-1}$, $y_{-2}$, . . . of the equation for $<y_1>$ is used as the multiplication factor of each coefficient circuit.

* * * * *